United States Patent
Kim et al.

(10) Patent No.: US 7,420,444 B2
(45) Date of Patent: Sep. 2, 2008

(54) RF MEMS SWITCH HAVING ASYMMETRICAL SPRING RIGIDITY

(75) Inventors: Jun-o Kim, Yongin-si (KR); Sang-wook Kwon, Seongnam-si (KR); Che-heung Kim, Yongin-si (KR); Jong-seok Kim, Taean-eup (KR); Hee-moon Jeong, Yongin-si (KR); Young-tack Hong, Suwon-si (KR); Sang-hun Lee, Seoul (KR)

(73) Assignee: Samsung Electronics CO., Ltd., Suwon-si (KR)

( * ) Notice: Subject to any disclaimer, the term of this patent is extended or adjusted under 35 U.S.C. 154(b) by 345 days.

(21) Appl. No.: 11/385,700

(22) Filed: Mar. 22, 2006

(65) Prior Publication Data
US 2007/0024401 A1 Feb. 1, 2007

(30) Foreign Application Priority Data
Jul. 27, 2005 (KR) ............ 10-2005-0068213

(51) Int. Cl.
*H01P 1/10* (2006.01)
(52) U.S. Cl. .................................... 333/262
(58) Field of Classification Search ........ 333/105, 333/262
See application file for complete search history.

(56) References Cited

U.S. PATENT DOCUMENTS

| 5,817,000 | A  | * | 10/1998 | Souder ................... 600/15 |
| 6,529,093 | B2 | * | 3/2003  | Ma ....................... 333/101 |
| 6,806,545 | B2 | * | 10/2004 | Shim ..................... 257/420 |
| 6,841,839 | B2 | * | 1/2005  | Sridhar et al. ............. 257/415 |

* cited by examiner

*Primary Examiner*—Benny Lee
*Assistant Examiner*—Alan Wong
(74) *Attorney, Agent, or Firm*—Sughrue Mion, PLLC

(57) ABSTRACT

An RF MEMS switch having asymmetrical spring rigidity. The RF MEMS switch has supporting members spaced apart in a certain interval on a substrate, a membrane being a motion member suspended by plural spring members extended on both sides of the membrane, and a bottom electrode being a contact surface on an upper surface of the substrate facing a bottom surface of the membrane, wherein the plural spring members placed on opposite sides of the membrane have asymmetrical rigidity, and a portion of the membrane on a side of stronger spring rigidity is first separated from the contact surface when the RF MEMS switch is turned off. The present invention has an advantage of easy separation of the switch from the contact surface, when the switch is turned off, due to the different rigidity of the springs located on the sides of the membrane.

13 Claims, 3 Drawing Sheets

RF MEMS SWITCH HAVING ASYMMETRICAL SPRING RIGIDITY

CROSS-REFERENCE TO RELATED APPLICATIONS

This application claims priority under 35 U.S.C. § 119 from Korean Patent Application No. 2005-68213, filed on Jul. 27, 2005, the entire contents of which are incorporated herein by reference.

BACKGROUND OF THE INVENTION

1. Field of the Invention

The present invention relates to an RF MEMS switch, and more particularly to an RF MEMS switch having asymmetrical spring rigidity to facilitate separation of the switch from a contacting surface when the switch is turned off.

2. Description of the Related Art

The MEMS (Micro Electro Mechanical System) refers to a micro electro-mechanical system manufactured through a semiconductor process. MEMS have been spotlighted recently because of their increasing application to a wider range of fields together with the advancement of mobile communication technologies. Of such MEMS products, a gyroscope, accelerometer, RF switch, and the like are currently applied to commercial products, and the developments of other diverse MEMS products are being accelerated.

The RF switch is an element that is frequently applied to signal routing, impedance matching networks, or the like in microwave or millimeter-wave bandwidth wireless communication terminals or systems.

In a conventional MMIC (Monolithic Microwave Integrated Circuit), GaAs FET's, PIN diodes, and the like are mainly used for implementation of the RF switch. However, the switch implemented with such elements has a drawback in that insertion loss is large while switched on and signal separation characteristics are poor when switched off.

Studies on mechanical switches have actively progressed in order to overcome such a drawback, and specifically, RF MEMS switches are required more than ever as the mobile communication terminal market has recently explosively expanded.

The RF MEMS switch is implemented such that signals are switched when a MEMS structure fabricated on a semiconductor substrate in a micro size contacts a signal electrode while moving, and signal transfers are cut off when the structure is spaced apart from the signal electrode.

However, such a conventional RF MEMS switch has a problem of difficulties in separating the switch from the contact surface when switched off due to the stiction force of the contact surface while switched on.

SUMMARY OF THE INVENTION

An aspect of the present invention is to provide an RF MEMS switch having asymmetrical spring rigidity which is driven with a low voltage as well as facilitates switch separation when switched off by overcoming stiction force while switched on.

According to another aspect, the RF MEMS switch has supporting members spaced apart in a certain interval on a substrate, a membrane being a motion member suspended by plural spring members extended on both sides of the membrane, and a bottom electrode being a contact surface on an upper surface of the substrate facing a bottom surface of the membrane, wherein the plural spring members placed on both sides of the membrane each have asymmetrical rigidity, and a portion of the membrane on a side of stronger spring rigidity is first separated from the contact surface when the RF MEMS switch is turned off.

The plural spring members may each have a different length.

When the RF MEMS switch is turned off, the membrane connected to a spring member having a short length may be first separated from the contact surface.

The plural spring members may each have a different width.

When the RF MEMS switch is turned off, the membrane connected to a spring member having a wide width may be first separated from the contact surface.

The plural spring members may each have a different thickness.

When the RF MEMS switch is turned off, the membrane connected to a spring member having a thick thickness may be first separated from the contact surface.

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF ILLUSTRATIVE, NON-LIMITING, EMBODIMENTS OF THE INVENTION

Figure 1:
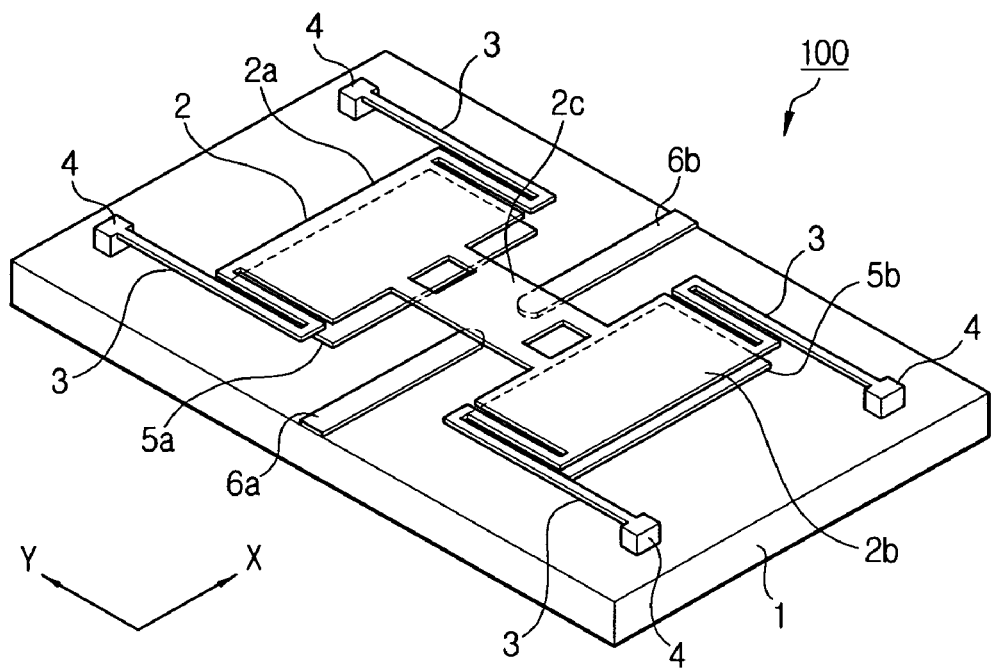
FIG. 1 is a schematic perspective view for showing a general prior art RF MEMS switch.

Hereinafter, the present invention will be described in detail with reference to the accompanying drawings. Common constituent elements will be explained with like reference numerals throughout the disclosure. The described exemplary embodiments are intended to assist in understanding the invention and are not intended to limit the invention in any way.

FIG. 1 is a schematic perspective view for showing a general prior art RF MEMS switch.

In FIG. 1, a driving stage 2 is located over a substrate 1, and the driving stage 2 is supported by springs 3 extended from four corners thereof and anchors 4 supporting the springs 3.

The stage 2 is provided with driving electrodes 2a and 2b on both sides thereof and a contact section 2c placed between the driving electrodes 2a and 2b. Fixed electrodes 5a and 5b are placed under the driving electrodes 2a and 2b, and signal lines 6a and 6b for switching are placed under the contact section 2c.

In such an RF MEMS switch, the stage 2 moves in the Z direction which is perpendicular to the substrate 1 by electrostatic force between the fixed electrodes 5a and 5b and the driving electrodes 2a and 2b, and, in here, when the stage 2 moves toward the substrate 1, the contact section 2c comes in contacts with both the signal lines 6a and 6b, which allows RF wave to propagate between the signal lines 6a and 6b.

Figure 2:
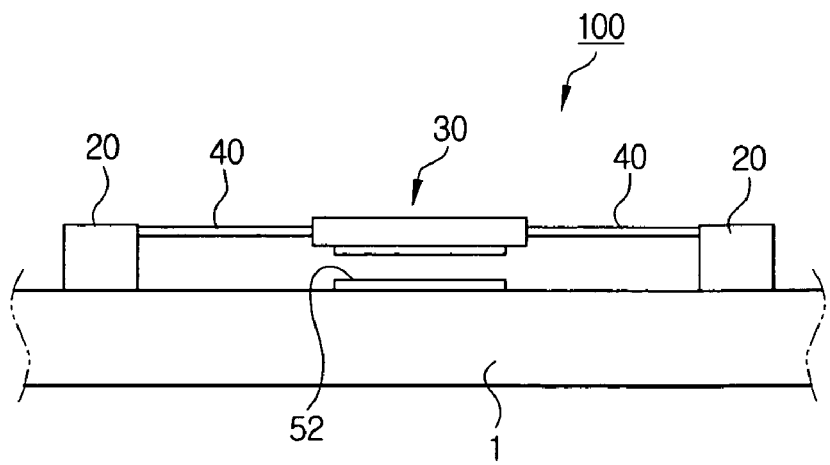
FIG. 2 is a view for showing a simple model of the prior art RF MEMS switch of FIG. 1.

FIG. 2 is a view for showing a simple model of the prior art RF MEMS switch of FIG. 1.

In FIG. 2, the RF MEMS switch 100 has supporting members 20 spaced apart from each other in a certain interval on the substrate 1, and has a motion member 30 suspended by spring members 40 placed on the supporting members 20 and extended from both sides of the motion member 20. A lower electrode 52 is provided on the upper surface of the substrate 1 facing the bottom surface of the motion member 30, which forms a driving member together with the motion member 30.

Figure 3A:
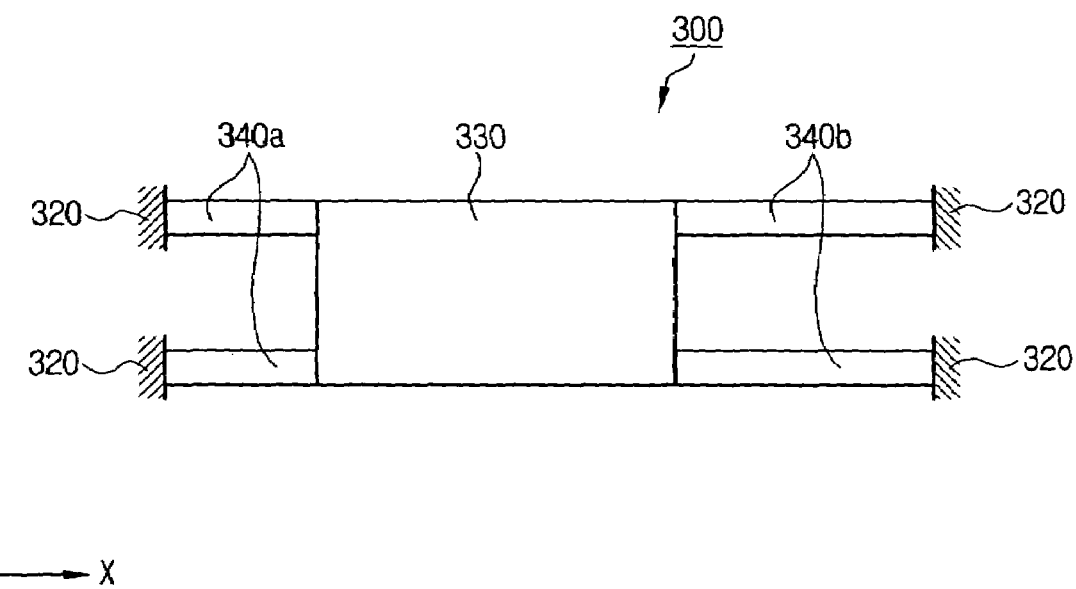
FIGS. 3A and 3B are schematic top and side views for showing a simple model of an RF MEMS switch according to an exemplary embodiment of the present invention.
Figure 3B:
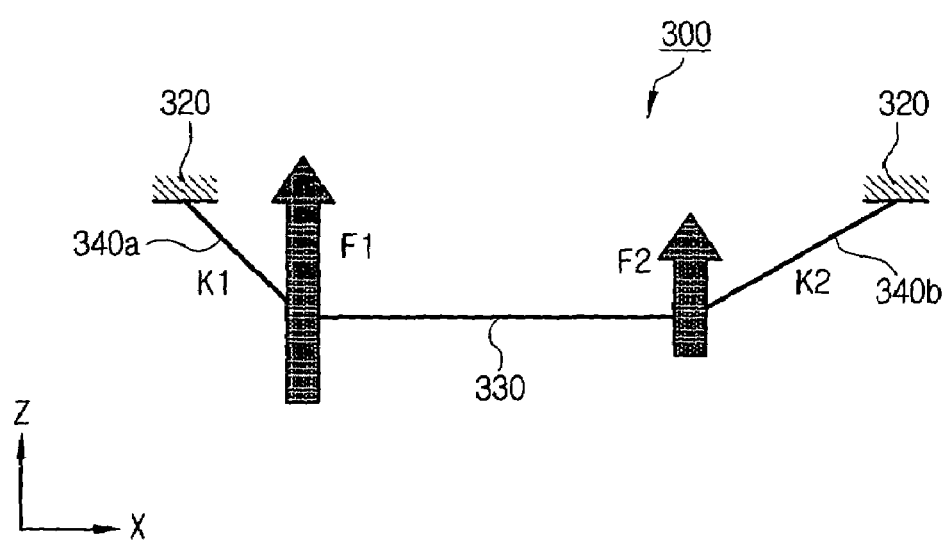

FIGS. 3A and 3B are schematic top and side views for showing a simple model of the RF MEMS switch according to an exemplary embodiment of the present invention.

In FIGS. 3A and 3B, a reference numeral 330 denotes a membrane being a motion member, reference numerals 340a and 340b denote springs, and a reference numeral 320 denotes an anchor being a supporting member.

The RF MEMS switch 300 according to an exemplary embodiment of the present invention has an asymmetrical structure in lengths of the springs 340a and 340b supporting the membrane 330 being a motion member, unlike the general RF MEMS switch 100. In here, the rigidity k1 of a first spring 340a having a short length becomes stronger than the rigidity k2 of a second spring 340b having a long length.

The rigidity of the spring is represented as a spring constant indicating the degree of the rigidity of the spring, and can be expressed in Equation 1.

$$k = \frac{Ewt^3}{L^3} \quad \text{[Equation 1]}$$

In Equation 1, k denotes a spring constant, E denotes Young's modulus, w denotes the width of the spring, t denotes the thickness of the spring, and L denotes the length of the spring.

That is, the rigidity of the spring is inversely proportional to the cube of the length L of the spring, and thus the rigidity of the first spring 340a having a short length becomes stronger than the rigidity of the second spring 340b having a long length.

Meanwhile, the relation between the restoring force of the spring and the spring constant is expressed in Equation 2 as below.

$$F = k\delta \quad \text{[Equation 2]}$$

In Equation 2, F denotes restoring force, k denotes a spring constant, and δ denotes displacement. On the other hand, since δ1 and δ2 are the same if the displacements of the first spring 340a and the second spring 340b are referred to as δ1 and δ2 respectively, the restoring forces F1 and F2 of the first spring 340a and the second spring 340b are proportional to the spring constant k1 of the first spring 340a and the spring constant k2 of the second spring 340b respectively.

Accordingly, the restoring force F1 of the first spring 340a having a short length becomes stronger than the restoring force F2 of the second spring 340b having a long length, while the switch 300 is turned on. That is, the relation of F1>F2 is formed.

Accordingly, when the switch 300 is turn off, a portion of the membrane 330 connected to a spring having a stronger rigidity, that is, the first spring 340a having a short length is first separated from a bottom electrode (not shown). As above, an exemplary embodiment of the present invention has an advantage of easy separation of the switch when the switch is turned off, since a portion of the membrane 330 is first separated from the bottom electrode.

Figure 4:
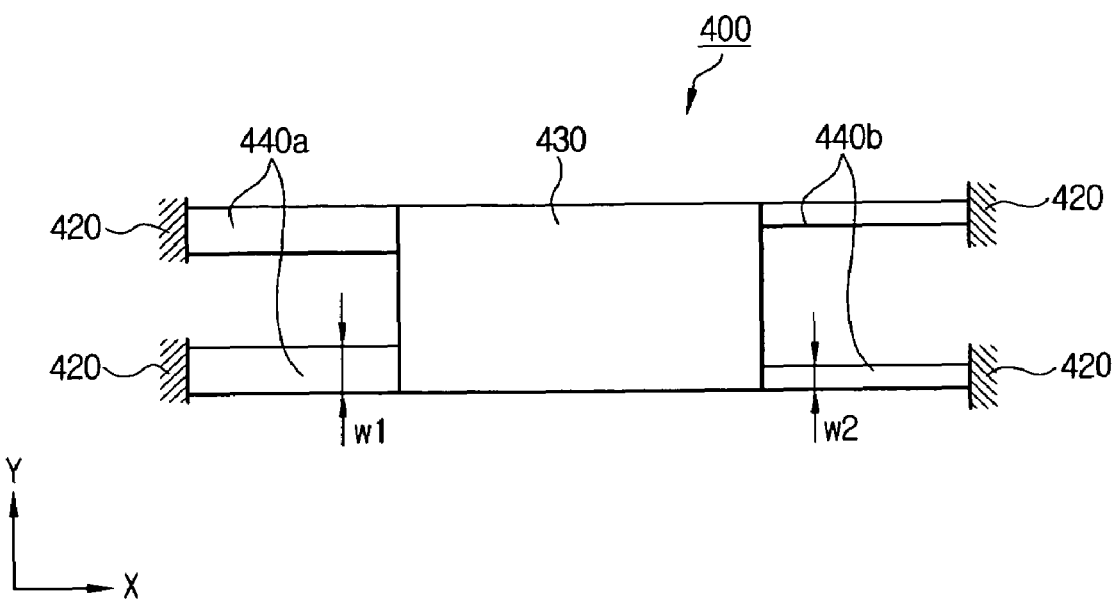
FIG. 4 is a schematic top view for showing a simple model of an RF MEMS switch according to another exemplary embodiment of the present invention.

FIG. 4 is a schematic top view for showing a simple model of an RF MEMS switch according to another exemplary embodiment of the present invention.

First, in FIG. 4, the RF MEMS switch 400 of the exemplary embodiment of the present invention has an asymmetrical structure since the width w1 of the first springs 440a is wider than the width w2 of the second spring 440b, unlike the general RF MEMS switch 100. The reference numeral 420 denotes an anchor, which serves as a supporting member.

When Equation 1 is referred to, the rigidity of a spring is proportional to the width of the spring, so the rigidity k1 of the first spring 440a having a wide width becomes stronger than the rigidity k2 of the second spring 440b having a narrow width.

In addition, when Equation 2 is referred to and the displacements of the first spring 440a and the second spring 440b are assumed to be δ1 and δ2 respectively, the restoring forces F1 and F2 of the first spring 440a and the second spring 440b are proportional to the spring constant k1 of the first spring 440a and the spring constant k2 of the second spring 440b respectively since δ1 and δ2 are the same.

Accordingly, while the switch 400 is turned on, the restoring force F1 of the first spring 440a having a wide width is stronger than the restoring force F2 of the second spring 440b having a narrow width. That is, a relation F1>F2 is formed.

In the same manner, when the switch 400 is turn off, the membrane 430 connected to a spring having a stronger rigidity, that is, the first spring 440a having a wide width is first separated from the bottom electrode (not shown). As with the above exemplary embodiment, this exemplary embodiment of the invention has an advantage of easy separation of the switch when the switch is turned off, since a portion of the membrane 430 is first separated from the bottom electrode.

Figure 5:
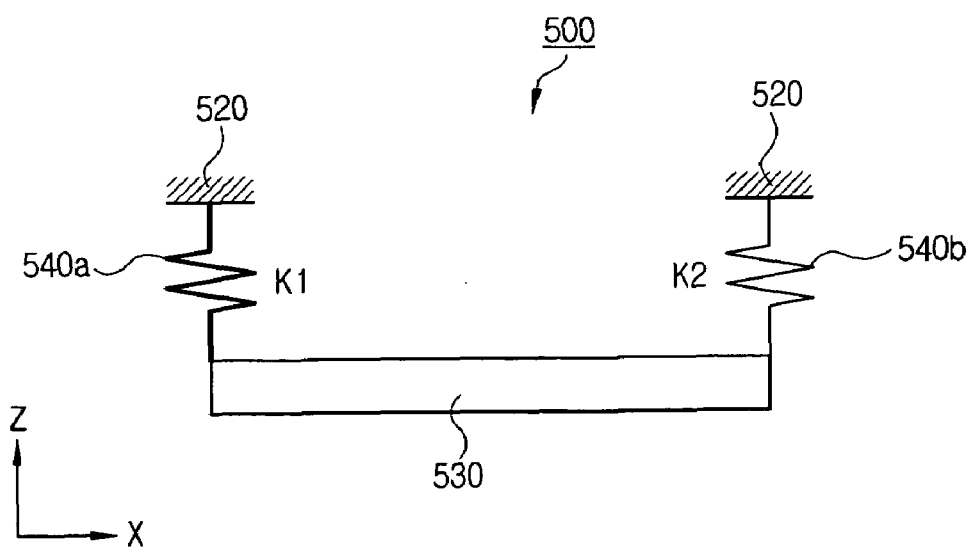
FIG. 5 is a schematic side view for showing a simple model of the RF MEMS switch according to another exemplary embodiment of the present invention.

FIG. 5 is a schematic side view for showing a simple model of the RF MEMS switch according to another exempalry embodiment of the invention.

In FIG. 5, the RF MEMS switch 500 of the exemplary embodiment of the present invention has an asymmetrical structure since the thickness t1 of the first springs 540a is thicker than the thickness t2 of the second spring 540b. Reference numeral 520 denotes an anchor, which serves as a supporting member.

When Equation 1 is referred to, the rigidity of the spring is proportional to the cube of the thickness of the spring, so the rigidity k1 of the first spring 540a having a thick thickness is stronger than the rigidity k2 of the second spring 540b having a thin thickness.

In addition, when Equation 1 is referred to and the displacements of the first spring 540a and the second spring 540b are assumed to be δ1 and δ2 respectively, the restoring forces F1 and F2 of the first spring 540a and the second spring 540b are proportional to the spring constant k1 of the first spring 540a and the spring constant k2 of the second spring 540b respectively, since δ1 and δ2 are the same.

Accordingly, while the switch 500 is turned on, the restoring force F1 of the first spring 540a having a thick thickness is stronger than the restoring force F2 of the second spring 540b having a thin thickness. That is, a relation F1>F2 is formed.

In the same manner, when the switch 500 is turn off, the membrane 530 connected to a spring having a stronger ridigity, that is, the first spring 540a having a thick thickness is first separated from the bottom electrode (not shown) being a contact surface. As with the above exemplary embodiments, the present exemplary embodiment of the present invention has an advantage of easy separation when the switch is turned off, since a portion of the membrane 530 is first separated from the bottom electrode As aforementioned, the exemplary embodiments of the present invention have an advantage of easy separation of the switch from the contact surface, when the switch is turned off, due to the different rigidity of the springs located on the left and right sides of the membrane being a motion member.

The foregoing embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. An RF MEMS switch having supporting members spaced apart in a certain interval on a substrate, a membrane being a motion member suspended by plural spring members extended on both sides of the membrane, and a bottom electrode being a contact surface on an upper surface of the substrate facing a bottom surface of the membrane,
   wherein the plural spring members placed on opposite sides of the membrane have asymmetrical rigidity, and a portion of the membrane on a side of stronger spring rigidity is first separated from the contact surface when the RF MEMS switch is turned off.

2. The RF MEMS switch as claimed in claim 1, wherein the plural spring members on opposite sides of the membrane have different lengths.

3. The RF MEMS switch as claimed in claim 2, wherein, when the RF MEMS switch is turned off, the side of the membrane connected to the spring member of relatively shorter length is separated from the contact surface before the side of the membrane connected to the spring member of relatively longer length.

4. The RF MEMS switch as claimed in claim 1, wherein the plural spring members on opposite sides of the membrane have different widths.

5. The RF MEMS switch as claimed in claim 4, wherein, when the RF MEMS switch is turned off, the side of the membrane connected to the spring member of relatively wider width is separated from the contact surface before the side of the membrane connected to the spring member of relatively narrower width.

6. The RF MEMS switch as claimed in claim 1, wherein the plural spring members on opposite sides of the membrane have different thicknesses.

7. The RF MEMS switch as claimed in claim 6, wherein, when the RF MEMS switch is turned off, the side of the membrane connected to the spring member having a relatively larger thickness is separated from the contact surface before the side of the membrane connected to the spring member having the relatively smaller thickness.

8. An RF MEMS switch comprising:
   a substrate;
   an electrode fixed to the substrate;
   a membrane suspended by a first spring member at a first side of the membrane and a second spring member at a second side of the membrane;
   wherein a rigidity of the first spring member is different than a rigidity of the second spring member; and
   wherein when the RF MEMS switch is turned on, at least a portion of the membrane contacts at least a portion of the electrode and when the RF MEMS switch is turned off, the membrane is separated from the electrode.

9. The RF MEMS switch of claim 8, wherein the first spring member is longer than the second spring member.

10. The RF MEMS switch of claim 8, wherein the first spring member is wider than the second spring member.

11. The RF MEMS switch of claim 8, wherein the first spring member is thicker than the second spring member.

12. The RF MEMS switch of claim 8, wherein the rigidity of the first spring member is greater than the rigidity of the second spring member and when the RF MEMS switch is turned off, the first side of the membrane separates from the electrode before the second side of the membrane.

13. The RF MEMS switch of claim 8, wherein the first and second spring members are fixed to the membrane by support members.

* * * * *